United States Patent
Huang et al.

(10) Patent No.: US 9,239,502 B2
(45) Date of Patent: Jan. 19, 2016

(54) PIXEL STRUCTURE WITH DATA LINE, SCAN LINE AND GATE ELECTRODE FORMED ON THE SAME LAYER AND MANUFACTURING METHOD THEREOF

(75) Inventors: Te-Chun Huang, New Taipei (TW); Hsiang-Lin Lin, Changhua County (TW); Kuo-Yu Huang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 119 days.

(21) Appl. No.: 13/541,757

(22) Filed: Jul. 4, 2012

(65) Prior Publication Data
US 2013/0161604 A1 Jun. 27, 2013

Related U.S. Application Data

(63) Continuation-in-part of application No. 13/466,195, filed on May 8, 2012, now Pat. No. 8,339,559.

(30) Foreign Application Priority Data

Dec. 23, 2011 (TW) .............................. 100148582 A

(51) Int. Cl.
| G02F 1/1343 | (2006.01) |
| G02F 1/1345 | (2006.01) |
| G02F 1/1333 | (2006.01) |
| H01L 27/12  | (2006.01) |
| G02F 1/1362 | (2006.01) |
| G02F 1/136  | (2006.01) |

(52) U.S. Cl.
CPC ...... *G02F 1/13458* (2013.01); *G02F 1/133345* (2013.01); *G02F 1/136227* (2013.01); *H01L 27/124* (2013.01); *H01L 27/1255* (2013.01); *H01L 27/1288* (2013.01); *G02F 1/136286* (2013.01); *G02F 2001/13606* (2013.01); *G02F 2001/13629* (2013.01); *G02F 2001/134318* (2013.01); *G02F 2001/136218* (2013.01)

(58) Field of Classification Search
CPC ..................... G02F 1/133345; G02F 1/136286; G02F 1/13629; G02F 2001/13629; G02F 2001/136295
USPC .......................................... 349/138, 139, 147
See application file for complete search history.

(56) References Cited

U.S. PATENT DOCUMENTS 4,938,567 A * 7/1990 Chartier ........................ 359/245
5,478,766 A * 12/1995 Park .................... H01L 27/1214
148/DIG. 105

(Continued)

FOREIGN PATENT DOCUMENTS

| CN | 101034685 | 9/2007 |
| TW | 559683    | 11/2003 |
| TW | 200735229 | 9/2007 |

*Primary Examiner* — Paisley L Arendt
(74) *Attorney, Agent, or Firm* — Jianq Chyun IP Office

(57) ABSTRACT

A pixel structure and a manufacturing method thereof are provided. The pixel structure includes a substrate, a scan line, a data line, a first insulating layer, an active device, a second insulating layer, a common electrode and a first pixel electrode. The data line crossed to the scan line is disposed on the substrate and includes a linear transmitting part and a cross-line transmitting part. The first insulating layer covering the scan line and the linear transmitting part is disposed between the scan line and the cross-line transmitting part. The active device, including a gate, an oxide channel, a source and a drain, is connected to the scan line and the data line. The second insulating layer is disposed on the oxide channel and the linear transmitting part. The common electrode is disposed above the linear transmitting part. The first pixel electrode is connected to the drain.

13 Claims, 16 Drawing Sheets

(56) References Cited

U.S. PATENT DOCUMENTS

| | | |
|---|---|---|
| 6,404,465 B1 | 6/2002 | Nakayama et al. |
| 6,421,102 B2 | 7/2002 | Nakayama et al. |
| 7,638,371 B2 | 12/2009 | Chen et al. |
| 8,107,029 B2 * | 1/2012 | Peng et al. .................. 349/47 |
| 2001/0002143 A1 | 5/2001 | Nakayama et al. |
| 2007/0212824 A1 | 9/2007 | Chen et al. |
| 2009/0167975 A1 | 7/2009 | Lee et al. |
| 2010/0301345 A1 * | 12/2010 | Lin et al. .................. 257/71 |

* cited by examiner

PIXEL STRUCTURE WITH DATA LINE, SCAN LINE AND GATE ELECTRODE FORMED ON THE SAME LAYER AND MANUFACTURING METHOD THEREOF

CROSS-REFERENCE TO RELATED APPLICATION

This application is a continuation-in-part of and claims the priority benefit of U.S. application Ser. No. 13/466,195, filed on May 8, 2012, now pending, and also claims the priority benefit of Taiwan application serial no. 100148582, filed on Dec. 23, 2011. The entirety of each of the above-mentioned patent applications is hereby incorporated by reference herein and made a part of this specification.

BACKGROUND OF THE INVENTION

1. Field of the Invention

The present invention generally relates to a structure of a device and a manufacturing method thereof, and in particular, to a pixel structure and a manufacturing method thereof.

2. Description of Related Art

A flat panel display mainly includes the following: an organic electroluminescence display, a plasma display panel and a thin film transistor liquid crystal display, where the thin film transistor liquid crystal display is the most widely used. Generally speaking, the thin film transistor liquid crystal display is mainly formed of a thin film transistor array substrate, a color filter substrate and a liquid crystal layer, where the thin film transistor array substrate includes multiple scan lines, multiple common electrode lines, multiple data lines, multiple active devices arranged in arrays and multiple pixel electrodes connected to the active devices, and each active device having a gate electrode, a source electrode and a drain electrode is electrically connected to the corresponding scan line and data line respectively.

The manufacturing procedure of the thin film transistor array substrate usually includes multiple times of photo-lithography and etching steps. In common manufacturing techniques, the gate electrode, the scan line and the common electrode line are constituted by use of the first conductive layer, the source electrode, the drain electrode and the data line are constituted by use of the second conductive layer, where at least one dielectric layer is disposed between the first conductive layer and the second conductive layer, and the second conductive layer is closer to the pixel electrode than the first conductive layer. Due to the coupling effect between the pixel electrode and the data line, such design usually affects the display voltage of the pixel electrode. Therefore, a technique that the data line is manufactured by using the first conductive layer is provided, and in such technique, the common electrode line is manufactured by only using the second conductive layer, so that the disposition areas of the common electrode line and the data line overlap to reduce the occupied area of the metal conductive components. However, the common electrode line at least partly overlaps with the data line, so that a so-called parasitic capacitance usually exists between the common electrode line and the data line. The existence of the parasitic capacitance will increase the load of the data line, which is unfavourable to the driving of the thin film transistor array.

SUMMARY OF THE INVENTION

Accordingly, the present invention is directed to a pixel structure, which may reduce the parasitic capacitance of the pixel structure and further reduce the electricity consumption of the pixel structure.

The present invention is also directed to a method of manufacturing a pixel structure, which may simplify manufacturing process steps for reducing the number of photo masks to decrease the required cost.

The present invention provides a pixel structure, which includes a substrate, a scan line, a data line, a first insulating layer, an active device, a second insulating layer, a common electrode and a first pixel electrode. The scan line is disposed on the substrate. The data line is disposed on the substrate, the data line is crossed to the scan line, and the data line includes a linear transmitting part and a cross-line transmitting part connected to each other, in which the cross-line transmitting part crosses over the scan line. The first insulating layer covers the scan line and the linear transmitting part and is located between the scan line and the cross-line transmitting part. The active device is connected to the scan line and the data line, in which the active device includes a gate electrode, an oxide channel, a source electrode and a drain electrode. The gate electrode is connected to the scan line. The oxide channel is located above the gate electrode, and the first insulating layer is located between the gate electrode and the oxide channel. The source electrode is connected to the cross-line transmitting part of the data line. The source electrode and the drain electrode are located at two sides of the oxide channel. The second insulating layer includes an etching blocking pattern located on the oxide channel and an isolation pattern located on the linear transmitting part, and the isolation pattern contacts the first insulating layer. The common electrode is disposed on the isolation pattern and located above the linear transmitting part. The first pixel electrode is connected to the drain electrode.

The present invention provides a method of manufacturing a pixel structure, which includes the following steps. A patterned first conductive layer is formed on a substrate to define a scan line, a gate electrode and a linear transmitting part, the gate electrode is connected to the scan line, and the linear transmitting part and the scan line are separated from each other, in which the extending direction of the scan line is crossed to the extending direction of the linear transmitting part. A first insulating layer is formed on the substrate to cover the scan line, the gate electrode and the linear transmitting part. An oxide channel located is formed on the first insulating layer to be above the gate electrode. A second insulating layer is formed on the first insulating layer and the oxide channel, in which the second insulating layer includes an etching blocking pattern located on the oxide channel and an isolation pattern located on the linear transmitting part, and the isolation pattern contacts the first insulating layer. A patterned second conductive layer is formed on the second insulating layer to form a source electrode, a drain electrode, a cross-line transmitting part and a common electrode, the source electrode and the drain electrode are located at two sides of the oxide channel, the cross-line transmitting part crosses over the scan line, and the common electrode is disposed on the isolation pattern and is located above the linear transmitting part. A first pixel electrode is formed on the substrate to be connected to the drain electrode.

Based on the above, in the pixel structure and the manufacturing method thereof according to the present invention, the linear transmitting part of the data line, the scan line and the gate electrode are formed on the same layer by patterning the first conductive layer, and the second insulating layer, located on the channel of the active device and used as the etching blocking layer, is further disposed on the linear transmitting part of the data line. In this case, when the common electrode manufactured via the second conductive layer overlaps with the linear transmitting part of the data line, multiple insulating layers are disposed between the linear transmitting part of the data line and the common electrode. In this way, the etching blocking pattern defined by the second insulating layer is used for protecting the channel, and the capacitive coupling effect between the data line and the common electrode is reduced by further disposing the second insulating layer between the linear transmitting part of the data line and the common electrode, so that the power consumption of the pixel structure is reduced.

In order to make the aforementioned features and advantages of the present invention more comprehensible, embodiments are illustrated in detail hereinafter with reference to accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
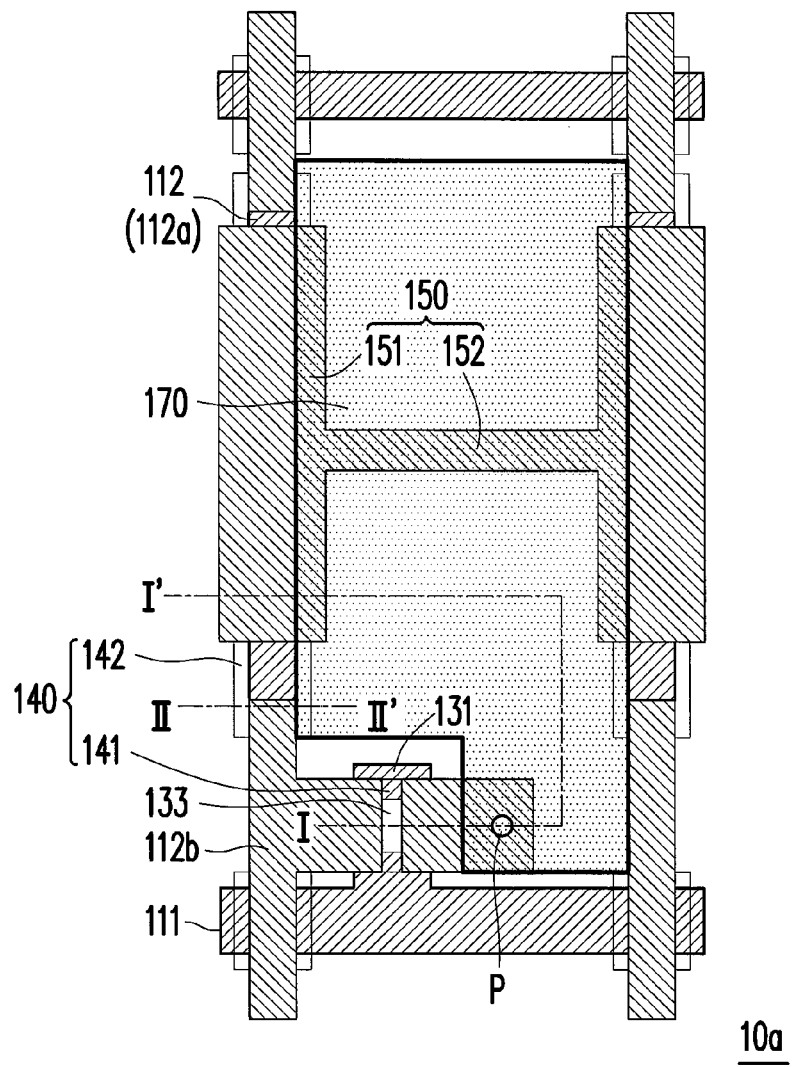
FIG. 1A is a schematic top view of a pixel structure of a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 1B:
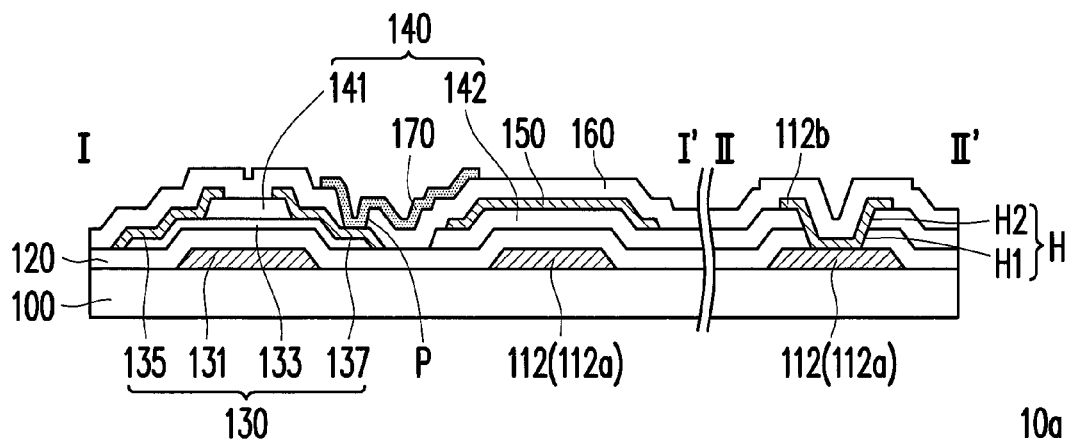
FIG. 1B is a cross-sectional view of the pixel structure in FIG. 1A along section lines I-I' and II-II'.

FIG. 1A is a schematic top view of a pixel structure of the first embodiment of the present invention, while FIG. 1B is a cross-sectional view of the pixel structure in FIG. 1A along section lines I-I' and II-II'. Referring to FIG. 1A and FIG. 1B, the pixel structure 10a of this embodiment includes a substrate 100, a scan line 111, a data line 112, a first insulating layer 120, an active device 130, a second insulating layer 140, a common electrode 150 and a first pixel electrode 170. The active device includes a gate electrode 131, an oxide semiconductor layer (or named an oxide channel) 133, a source electrode 135 and a drain electrode 137.

Specifically speaking, the scan line 111 is disposed on the substrate 100. The data line 112 is disposed on the substrate 100, the scan line 111 is crossed to the data line 112, and the data line 112 includes a linear transmitting part 112a and a cross-line transmitting part 112b connected to each other, where the cross-line transmitting part 112b crosses over the scan line 111. The first insulating layer 120 covers the scan line 111 and the linear transmitting part 112a of the data line 112, and is located between the scan line 111 and the cross-line transmitting part 112b. The active device 130 is connected to the scan line 111 and the data line 112. The gate electrode 131 is connected to the scan line 111. The oxide channel 133 is located above the gate electrode 131, and the first insulating layer 120 is located between the gate electrode 131 and the oxide channel 133. The source electrode 135 is connected to the cross-line transmitting part 112b of the data line 112. The source electrode 135 and the drain electrode 137 are located at two sides of the oxide channel 133. The second insulating layer 140 includes an etching blocking pattern 141 located on the oxide channel 133 and an isolation pattern 142 located above the linear transmitting part 112a, and the isolation pattern 142 contacts the first insulating layer 120. The common electrode 150 is disposed on the isolation pattern 142 and located above the linear transmitting part 112a. The first pixel electrode 170 is connected to the drain electrode 137.

Figure 2A:
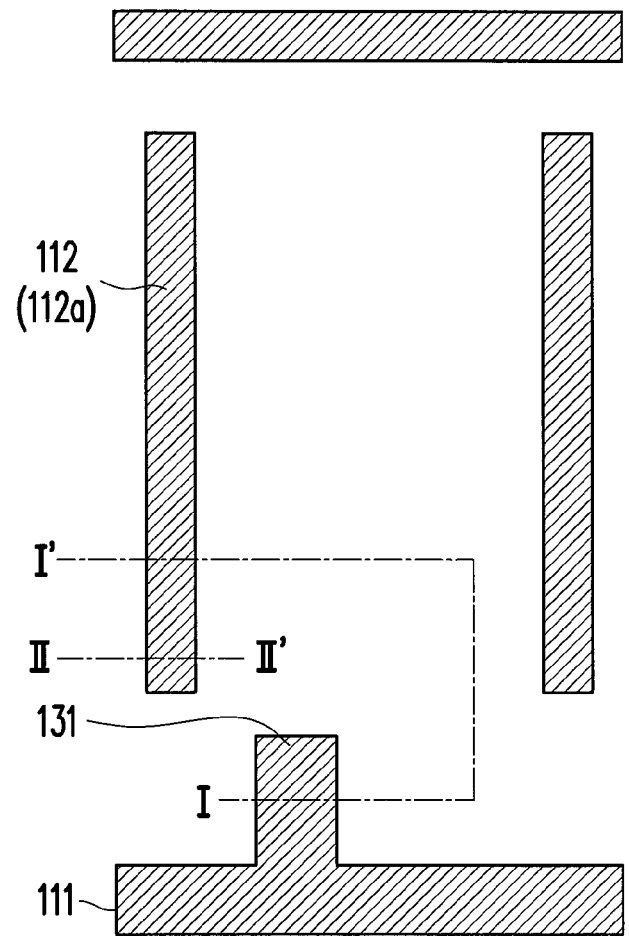
FIG. 2A is a schematic top view of a pixel structure of a first embodiment of the present invention.
Figure 2B:
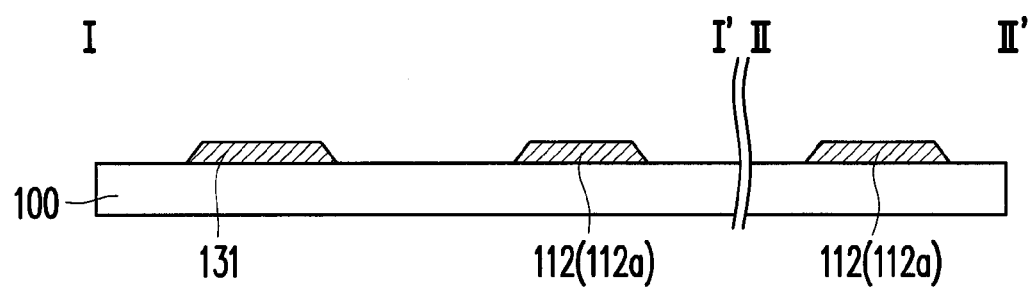
FIG. 2B is a cross-sectional view of the pixel structure in FIG. 2A along section lines I-I' and II-II'.

The steps of the method of manufacturing the pixel structure 10a are as follows. FIGS. 2A-9A are schematic top views explaining the method of manufacturing the pixel structure 10a, while FIGS. 2B-9B are cross-sectional views of FIGS. 2A-9A along section lines I-I' and II-II'. First, the first conductive layer (not shown) is formed on the substrate 100, and the first conductive layer is patterned via the photo mask process (which includes steps of photo-lithography and etching, but is not limited to this, and which may also include a laser ablation process) to form the scan line 111, the gate electrode 131 and the linear transmitting part 112a of the data line 112 as shown in FIG. 2A and FIG. 2B. However, the scan line 111, the gate electrode 131 and the linear transmitting part 112a of the data line 112 may be manufactured on the substrate 100 via the way of printing process or the way of inkjet printing process selectively.

In an embodiment, the material of the substrate 100 may be glass, quartz, an organic polymer or flexible material to support the pixel structure 10a and provide good light transmittance. However, the material of the substrate 100 may be an opaque material selectively. The gate electrode 131 is connected to the scan line 111, and the linear transmitting part 112a and the scan line 111 are separated from each other, where the extending direction of the scan line 111 is crossed to the extending direction of the linear transmitting part 112a. The material of the first conductive layer (not shown) in this embodiment may include metal materials like molybdenum (Mo), aluminum (Al), titanium (Ti), silver, gold and copper, alloy or other conductive materials; besides, the first conductive layer is not limited to a single layer, and may be constituted by two layers or multiple layers of different metals, alloys or other conductive materials.

Figure 3A:
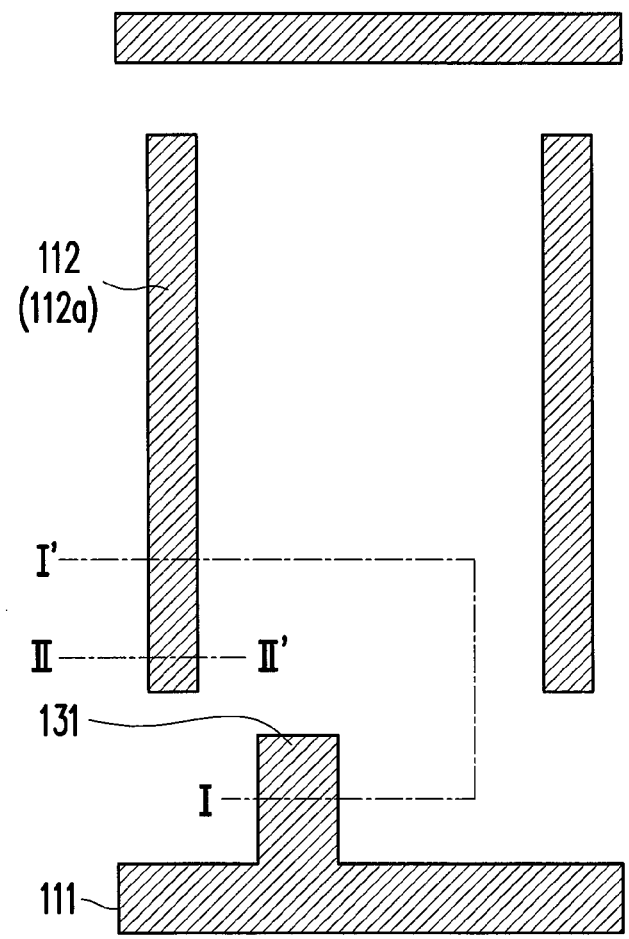
FIG. 3A is a schematic top view of a pixel structure of a first embodiment of the present invention.
Figure 3B:
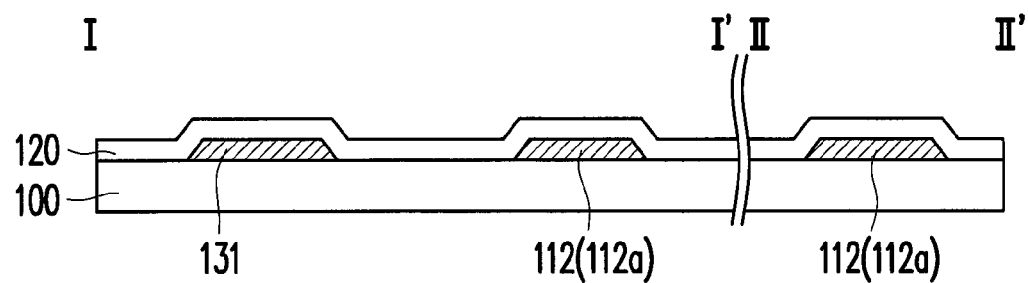
FIG. 3B is a cross-sectional view of the pixel structure in FIG. 3A along section lines I-I' and II-II'.

Referring to FIG. 3A and FIG. 3B, the first insulating layer 120 is formed on the substrate 100, and the first insulating layer 120 covers the scan line 111, the gate electrode 131 and the linear transmitting part 112a. The first insulating layer 120 is formed by, for example, physical vapor deposition (PVD), chemical vapor deposition (CVD) or other proper thin-film deposition techniques, while the first insulating layer 120 may be a single-layer or a multiple-layer structure, and the material thereof is, for example, dielectric materials like silicon oxide, silicon nitride or silicon oxynitride, or the first insulating layer 120 is constituted by a mixture of multiple layers of different dielectric materials. Definitely, in other embodiments, the material of the first insulating layer 120 also includes an organic material manufactured by using the ways of photo-lithography development, printing process or inkjet printing process, and the multiple-layer stacked structure of inorganic materials and organic materials may also be used.

Figure 4A:
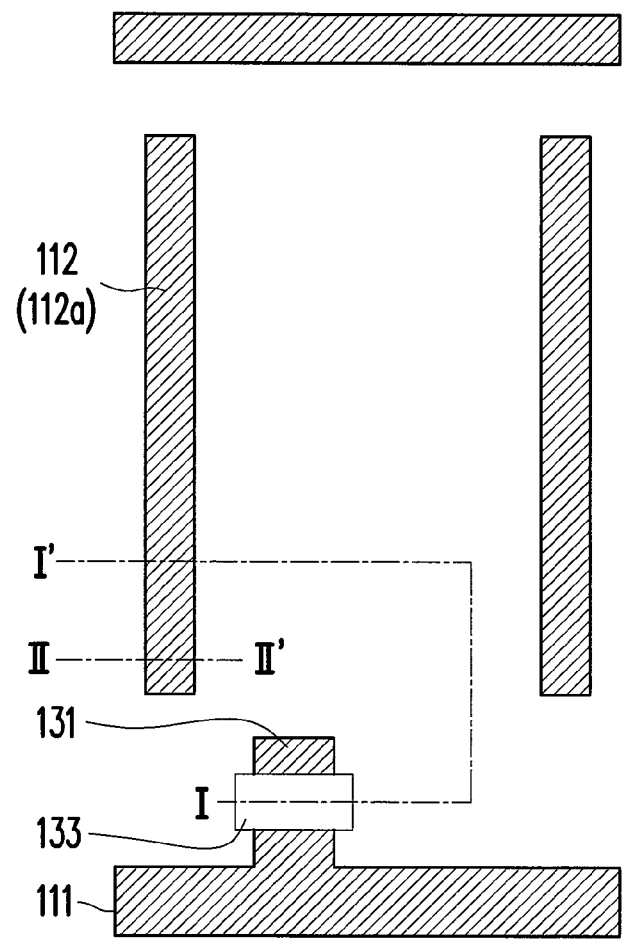
FIG. 4A is a schematic top view of a pixel structure of a first embodiment of the present invention.
Figure 4B:
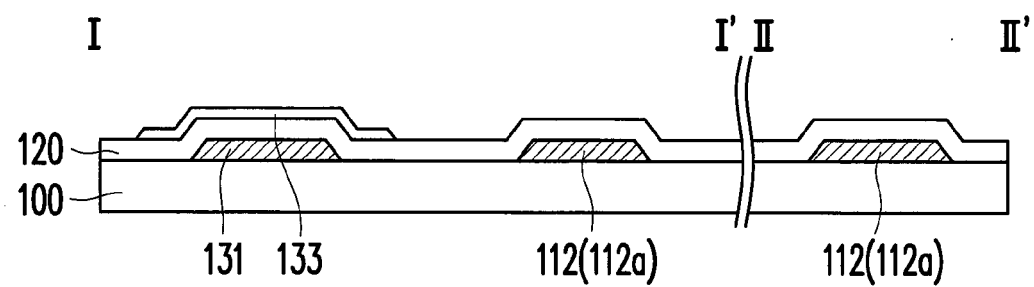
FIG. 4B is a cross-sectional view of the pixel structure in FIG. 4A along section lines I-I' and II-II'.

Referring to FIG. 4A and FIG. 4B, the oxide channel 133 located above the gate electrode 131 is formed on the first insulating layer 120. More specifically, a single-layer or multiple-layer structure of the oxide semiconductor material layer (not shown) is formed on the first insulating layer 120 first, and the material of the structure is, for example, IGZO, IZO, IGO, ZnO, $2CdO \cdot GeO_2$ or $NiCo_2O_4$. Then, the oxide semiconductor material layer is patterned into the oxide channel 133 via the photo-lithography and etching processes or other patterning processes. Definitely, in other embodiments, the material of the oxide channel 133 also includes an organic material manufactured by ways of photo-lithography development, printing or inkjet, and the multiple-layer stacked structure of inorganic materials and organic materials may also be used.

Figure 5A:
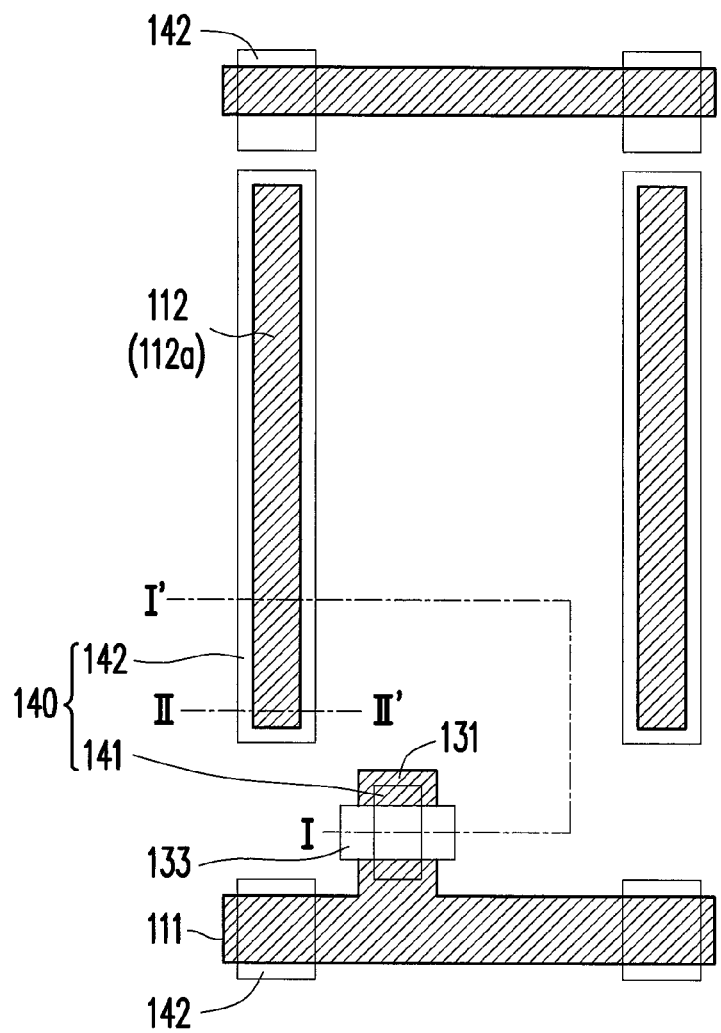
FIG. 5A is a schematic top view of a pixel structure of a first embodiment of the present invention.
Figure 5B:
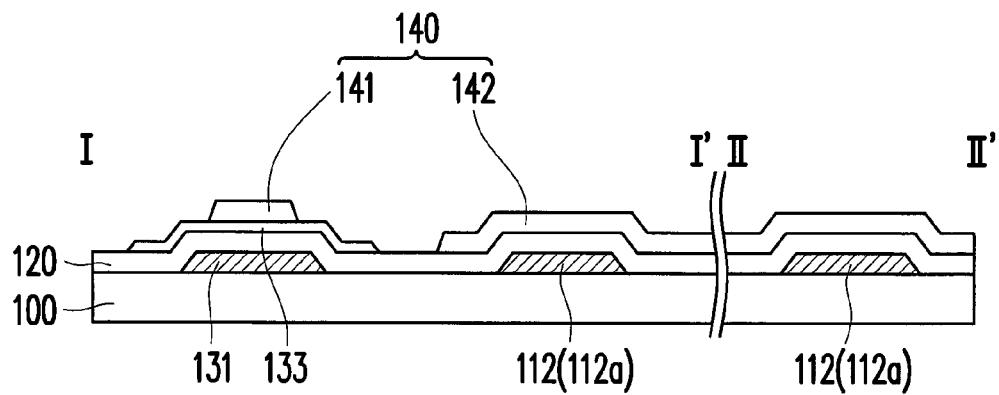
FIG. 5B is a cross-sectional view of the pixel structure in FIG. 5A along section lines I-I' and II-II'.

Referring to FIG. 5A and FIG. 5B, the second insulating layer 140 is formed on the first insulating layer 120 and the oxide channel 133. The second insulating layer 140 includes the etching blocking pattern 141 and the isolation pattern 142, where the etching blocking pattern 141 is located on the oxide channel 133 and used to protect the oxide channel 133 and provide the etching stop effect. The profile of the etching blocking pattern 141 is, for example, a rectangle, but the present invention is not limited to this, it may be a polygon or a curved shape. The isolation pattern 142 is located above the linear transmitting part 112a and above a portion of the scan line 111, and the isolation pattern 142 contacts the first insulating layer 120. In addition, the second insulating layer 140 of this embodiment may be a single-layer or multiple-layer structure, and the material thereof is, for example, dielectric materials like silicon dioxide, silicon nitride or silicon oxynitride, and the second insulating layer 140 may be formed of a mixture of multiple layers of different dielectric materials. In other embodiments, the manufacturing method and the contained materials of the first insulating layer 120 can be used for fabricating the second insulating layer 140.

Figure 6A:
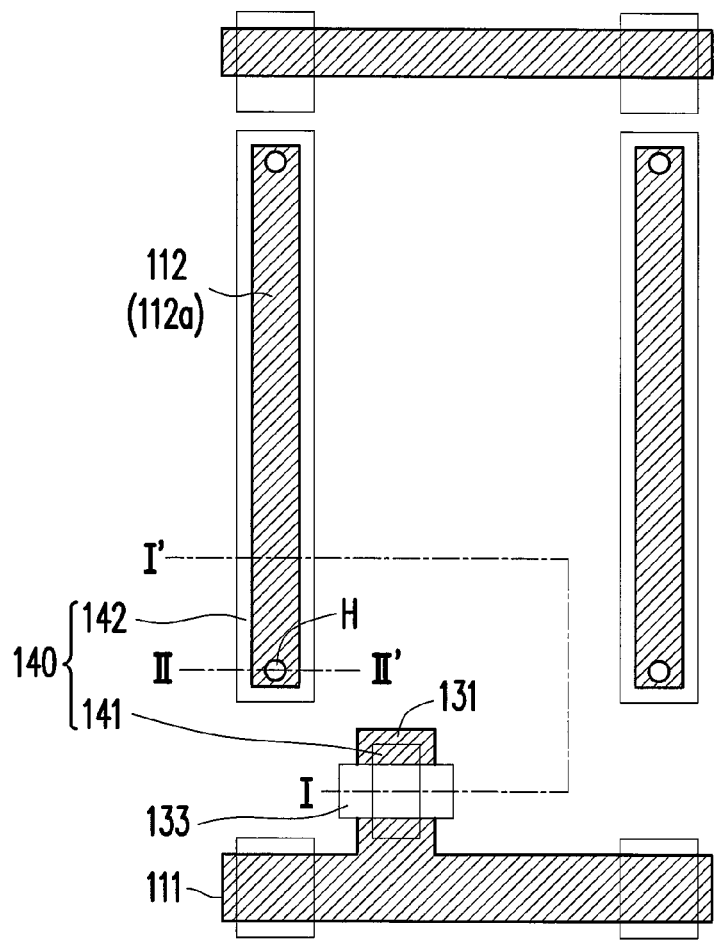
FIG. 6A is a schematic top view of a pixel structure of a first embodiment of the present invention.
Figure 6B:
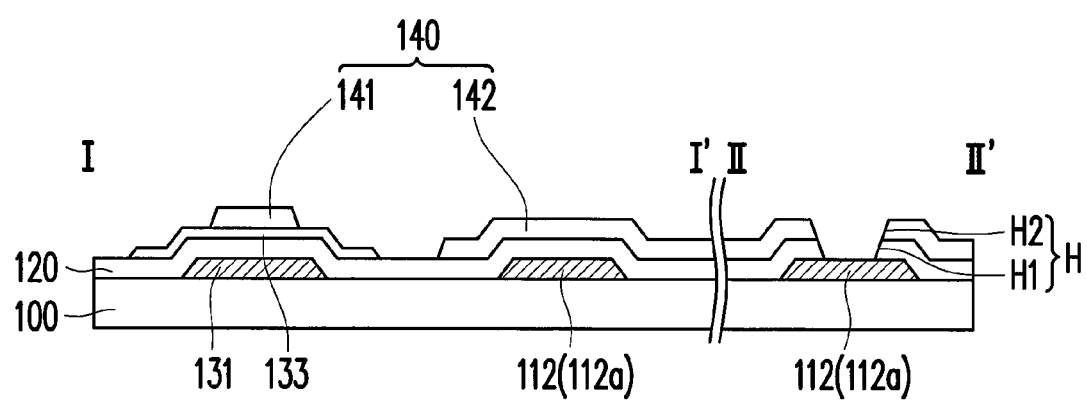
FIG. 6B is a cross-sectional view of the pixel structure in FIG. 6A along section lines I-I' and II-II'.

Referring to FIG. 6A and FIG. 6B, a first opening H1 and a second opening H2 are formed on the first insulating layer 120 and the second insulating layer 140 respectively via the photo-lithography and etching processes to constitute a contact opening H respectively exposing two opposite ends of the linear transmitting part 112a, the contact opening H is used to electrically connect the cross-line transmitting part 112b formed afterwards to the linear transmitting part 112a. In this embodiment, the first opening H1 and the second opening H2 connected to each other may be manufactured by the same photo-lithography process or different photo-lithography processes.

Figure 7A:
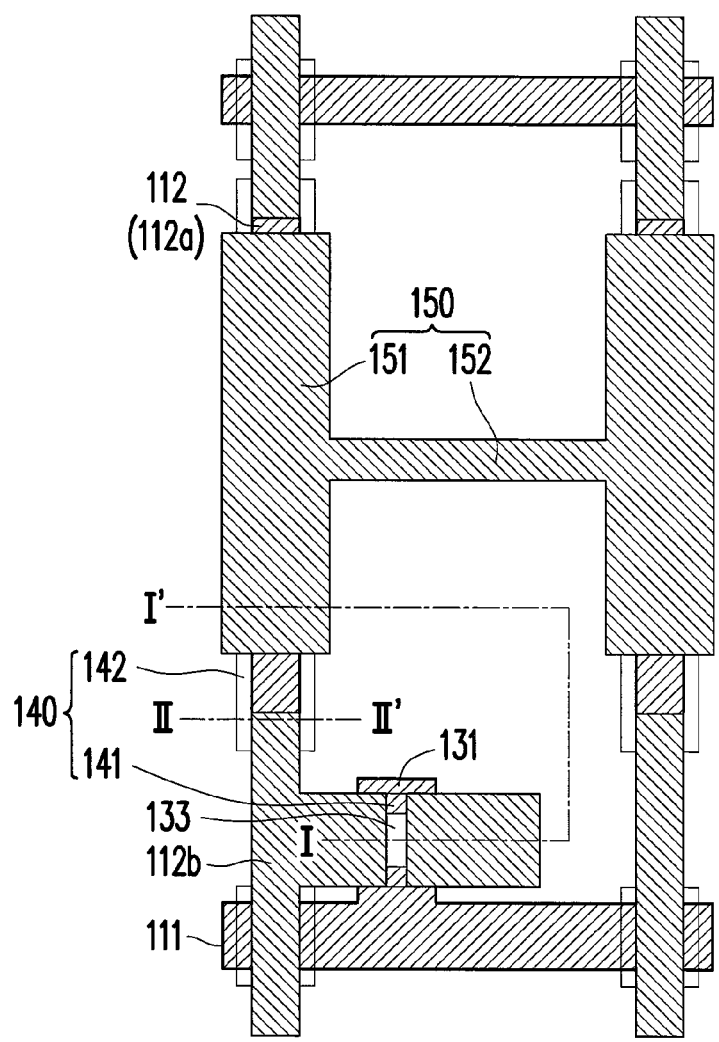
FIG. 7A is a schematic top view of a pixel structure of a first embodiment of the present invention.
Figure 7B:
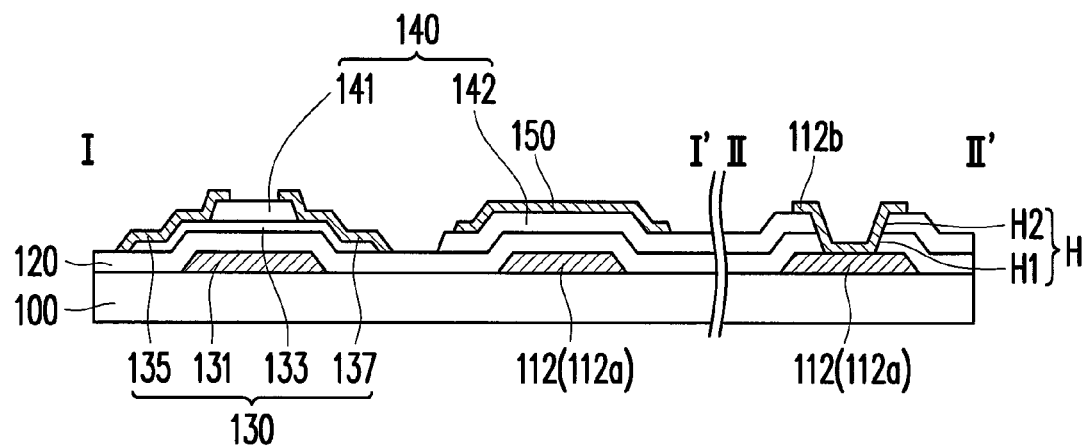
FIG. 7B is a cross-sectional view of the pixel structure in FIG. 7A along section lines I-I' and II-II'.

Next, the second conductive layer (not shown) is formed on the first insulating layer 120 and the second insulating layer 140, and the second conductive layer is patterned via the photo-lithography and etching processes to form the source electrode 135, the drain electrode 137, the cross-line transmitting part 112b and the common electrode 150 on the first insulating layer 120 and the second insulating layer 140, as shown in FIG. 7A and FIG. 7B, wherein the aforementioned components are separated from each other. The material of the second conductive layer is, for example, a metal material like aluminum (Al), molybdenum (Mo), titanium (Ti), or neodymium (Nd), alloy or other conductive materials, and the second conductive layer is not limited to a single layer, and may be constituted by multiple layers or multiple kinds of conductive materials. However, the source electrode 135, the drain electrode 137, the cross-line transmitting part 112b and the common electrode 150 may be manufactured on the first insulating layer 120 and the second insulating layer 140 by ways of printing process or inkjet printing process selectively.

In this embodiment, the source electrode 135 and the drain electrode 137 are located at two sides of the oxide channel 133 to form the active device 130 together with the gate electrode 131, i.e., the active device 130 has the structure formed of the gate electrode 131, the oxide channel 133, the source electrode 135 and the drain electrode 137. It should be noted that the oxide channel 133 is covered by the etching blocking pattern 141, so that the etchant/solvent used for patterning the second conductive layer will not contact the part, located between the source electrode 135 and the drain electrode 137, of the oxide channel 133, so as to prevent the oxide channel 133 from being damaged. In this way, the oxide channel 133 can provide good characteristics.

In addition, the cross-line transmitting part 112b crosses over the scan line 111, and is connected to the linear transmitting part 112a of the data line 112 via the contact opening H so that signals can be transferred through the data line 112. That is to say, the data line 112 is a continuous transferring path constituted by different conductive layers, and the transferring path is crossed to the scan line 111 and will not be connected to the scan line 111. The common electrode 150 is disposed on the isolation pattern 142 and located above the linear transmitting part 112a. Besides, the common electrode 150 includes a first part 151 and a second part 152 connected to each other, and the first part 151 substantially overlaps the linear transmitting part 112a, while the extending direction of the second part 152 is crossed to the extending direction of the first part 151. Preferably, the width of the first part 151 is substantially larger than the line width of the linear transmitting part 112a to completely overlap the linear transmitting part 112a in the width direction. The first part 151 contacts the isolation pattern 142 of the second insulating layer 140, but the present invention is not limited to this.

That is to say, at least the first insulating layer 120 and the isolation pattern 142 of the second insulating layer 140 are disposed between the first part 151 of the common electrode 150 and the linear transmitting part 112a of the data line 112. In this way, the capacitive coupling effect between the first part 151 of the common electrode 150 and the linear transmitting part 112a of the data line 112 is reduced because of existence of at least two layers of insulating layers. That is to say, the parasitic capacitance between the first part 151 of the common electrode 150 and the linear transmitting part 112a of the data line 112 is obviously reduced, which is favourable to reduce the load of the common electrode 150 and the data line 112.

Figure 8A:
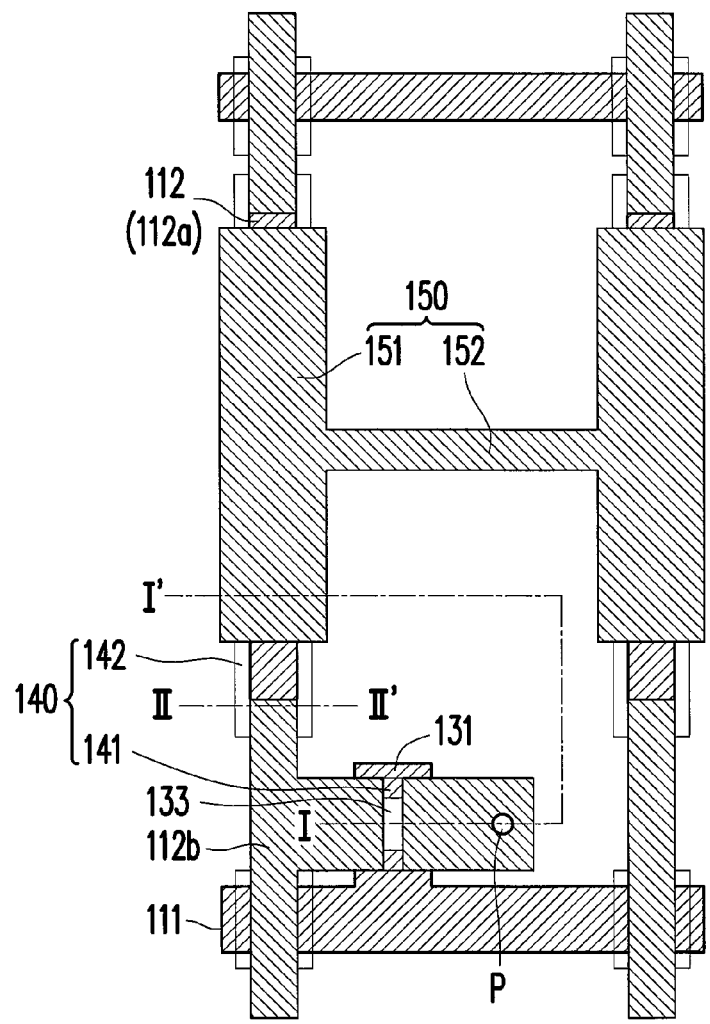
FIG. 8A is a schematic top view of a pixel structure of a first embodiment of the present invention.
Figure 8B:
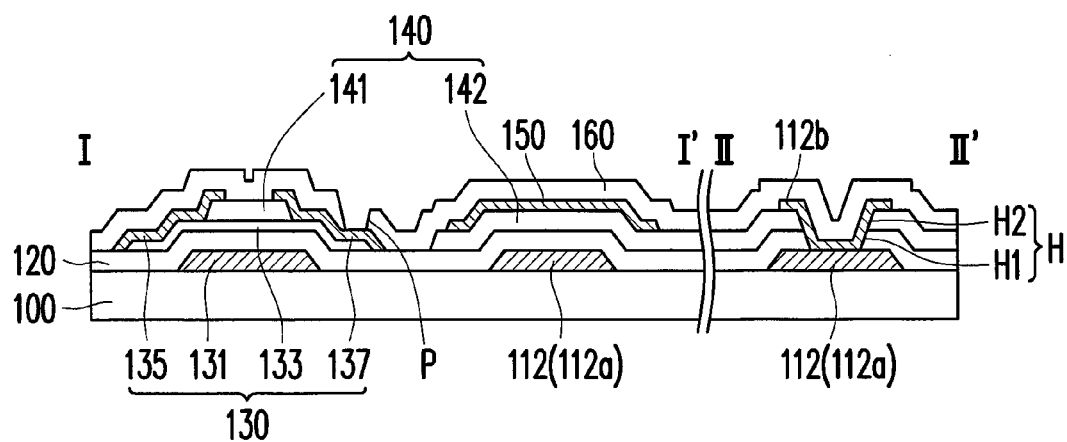
FIG. 8B is a cross-sectional view of the pixel structure in FIG. 8A along section lines I-I' and II-II'.

Referring to FIG. 8A and FIG. 8B, the substrate 100 is covered by a third insulating layer 160, i.e., the third insulating layer 160 covers the active device 130 and the common electrode 150, and a third opening p is formed in the third insulating layer 160. The third insulating layer 160 may be a single-layer or multiple-layer structure, and the material thereof is, for example, silicon nitride or silicon oxide, while the forming method thereof is, for example, complete deposition on the substrate 100 via PVD or CVD, and then the third opening p is formed in the third insulating layer 160 via, for example, patterning ways such as the photo-lithography and etching processes. In other embodiments, the manufacturing method and contained materials of the first insulating layer 120 may be used for forming the third insulating layer 160.

Referring to FIG. 1A and FIG. 1B again, the first pixel electrode 170 is formed on the substrate 100, and the first pixel electrode 170 is connected to the drain electrode 137. More specifically, the first pixel electrode 170 is substantially located on the third insulating layer 160, where the first pixel electrode 170 is electrically connected to the drain electrode 137 via the third opening p of the third insulating layer 160. Besides, the second part 152 of the common electrode 150 substantially overlaps the first pixel electrode 170, and the first part 151 of the common electrode 150 substantially surrounds an edge of the first pixel electrode 170, so that the common electrode 150 and the first pixel electrode 170 partly overlap to form a storage capacitor.

In the pixel structure 10a of this embodiment, since the part of the data line 112, i.e., the linear transmitting part 112a of the data line 112, and the gate electrode 131 are formed by the same layer, while the linear transmitting part 112a of the data line 112 and the common electrode 150 are spaced by one or more layers of insulating layers, i.e., spaced by the first insulating layer 120 and the isolation pattern 142 of the second insulating layer 140, the etching blocking pattern 141 can be manufactured on the oxide channel 133, and the same material layer can be disposed between the data line 112 and the common electrode 150 for reducing the coupled capacitance. In addition, in this embodiment, the first part 151 of the common electrode 150 is disposed between the pixel electrode 170 and the linear transmitting part 112a of the data line 112 so that the coupling effect does not occurred between the pixel electrode 170 and the linear transmitting part 112a of the data line 112. Hence, the pixel electrode 170 may cover the linear transmitting part 112a of the data line 112 to increase the display aperture ratio of the pixel structure 10a. When the pixel structure 10a is applied to the display apparatus, the power consumption of the display apparatus may be reduced and the luminance may be increased.

The following text will explain the design of the pixel structures 10b-10d in different implementation forms. It shall be noted that the reference numerals and some content of the previous embodiments are still used in the following embodiments, and the same reference numerals are used to indicate the same or similar components, with the explanation of the same technical contents being omitted. For the omitted portions, reference is made to the previous embodiments, which will not be described again here.

Second Embodiment

Figure 9A:
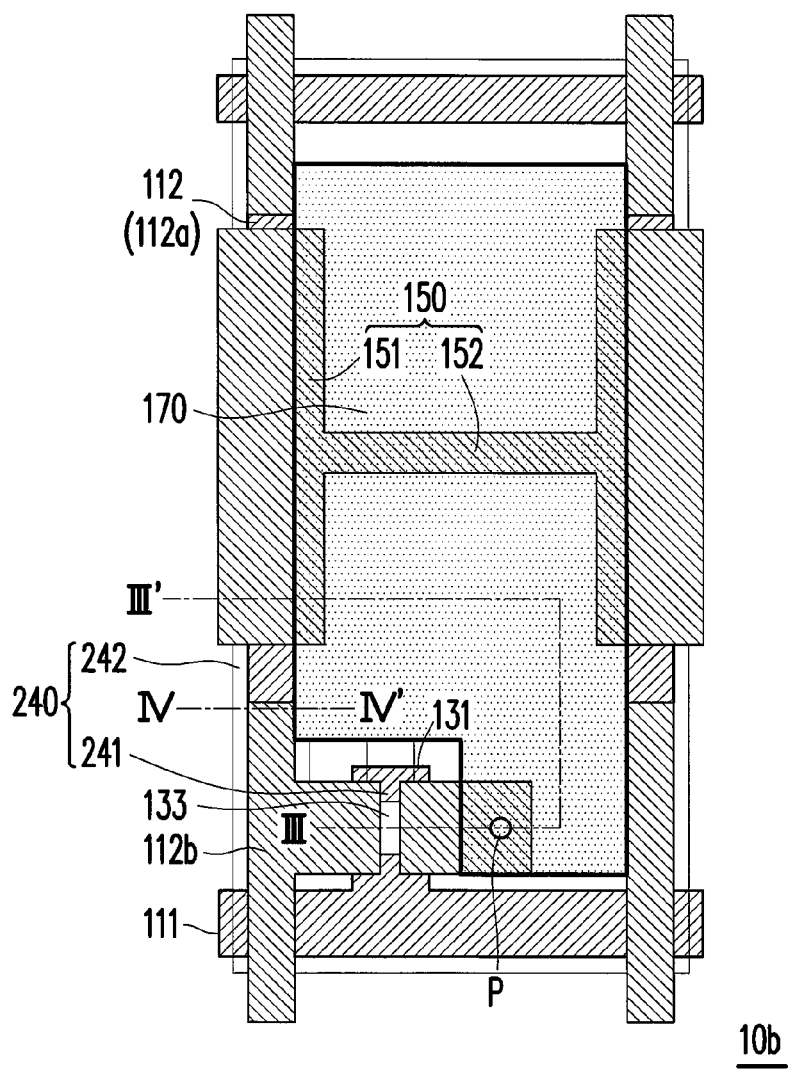
FIG. 9A is a schematic top view of a pixel structure of a second embodiment of the present invention.
Figure 9B:
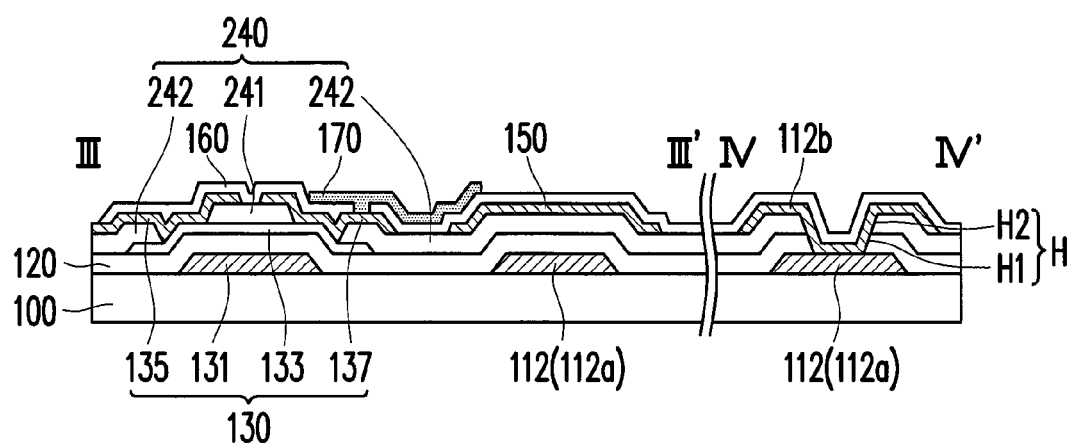
FIG. 9B is a cross-sectional view of the pixel structure in FIG. 9A along section lines III-III' and IV-IV'.

FIG. 9A is a schematic top view of a pixel structure of the second embodiment of the present invention, while FIG. 9B is a cross-sectional view of the pixel structure in FIG. 9A along section lines III-III' and IV-IV'. Referring to FIG. 9A and FIG. 9B, the pixel structure 10b in this embodiment is similar to the pixel structure 10a in the previous embodiment, and the difference between the both lies in: in the pixel structure 10b of this embodiment, the second insulating layer 240 is further formed between the first insulating layer 120 and the pixel electrode 170.

Figure 10A:
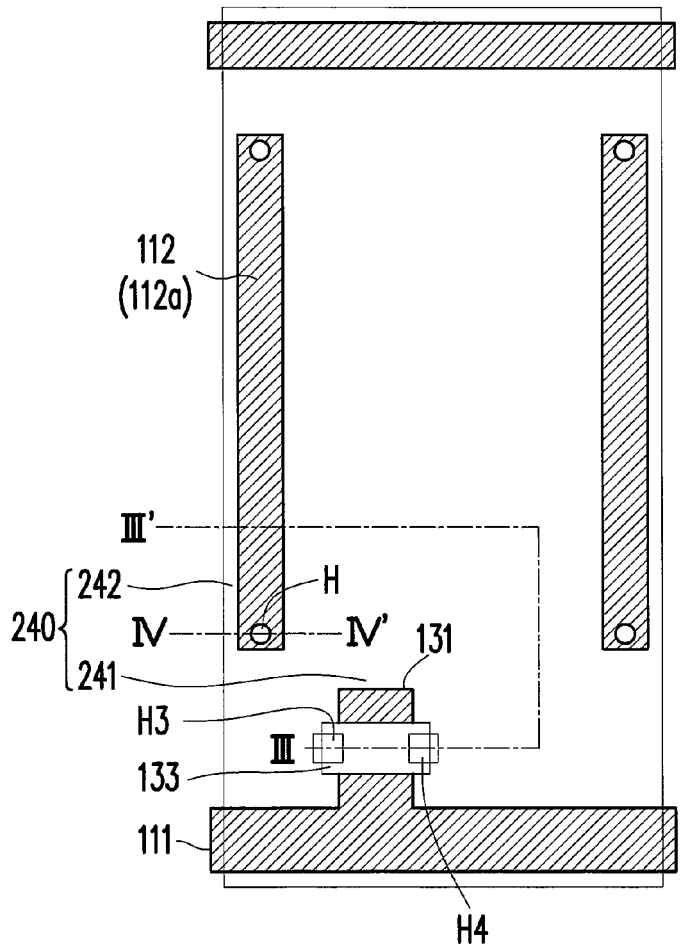
FIG. 10A is a schematic top view of a pixel structure of a second embodiment of the present invention.
Figure 10B:
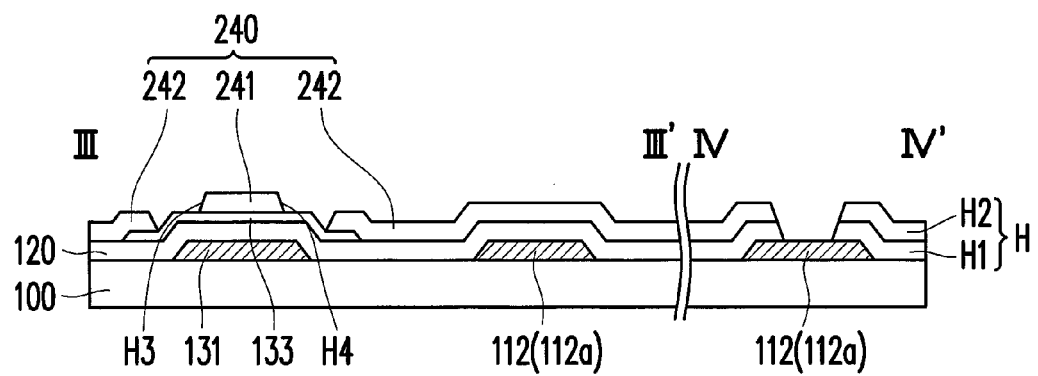
FIG. 10B is a cross-sectional view of the pixel structure in FIG. 10A along section lines III-III' and IV-IV'.

More specifically, in the pixel structure 10b, the manufacturing methods of the scan line 111, the gate electrode 131, the linear transmitting part 112a of the data line 112, the first insulating layer 120 and the oxide channel 133 may refer to the explanations in FIGS. 2A-2B to FIGS. 4A-4B in the first embodiment, and they will not be repeated herein. Moreover, after manufacturing the aforementioned components, as shown in FIG. 10A and FIG. 10B, the second insulating layer 240 is formed on the first insulating layer 120 and the oxide channel 133, and multiple openings H1, H2, H3, and H4 are formed in the first insulating layer 120 and the second insulating layer 240 via the photo-lithography and etching processes. Specifically speaking, the first opening H1 and the second opening H2 are formed on the first insulating layer 120 and the second insulating layer 240 respectively to constitute the contact opening H exposing the two opposite ends of the linear transmitting part 112a. Besides, the opening H3 and the opening H4 both expose the oxide channel 133 and are located on two sides of the gate electrode 131 respectively. In this case, the second insulating layer 240, for example, includes the etching blocking pattern 241 corresponding to the upper part of the gate electrode 131 and covering the oxide channel 133 and the isolation pattern 242 covering the first insulating layer 120.

The difference between the pixel structure 10b in this embodiment and the pixel structure 10a in the first embodiment lies in: the photo mask used to pattern the second insulating layer 240 has a different pattern layout. Hence, in this embodiment, only parts, corresponding to the openings H1, H2, H3, and H4, of the second insulating layer 240 are removed so that the isolation pattern 242 covers a large part of the first insulating layer 120. Comparing to that, the isolation pattern 242 of the pixel structure 10a substantially corresponds to the area where the linear transmitting part 112a is located only. In addition, the shapes of the opening H3 and the opening H4 are only exemplarily explained in this embodiment, which are not particularly limited to the rectangle, and may also be other polygons or curved shapes. In other embodiments, all designs of opening, that expose the positions in the oxide channel 133 predetermined to contact the source electrode and the drain electrode, may be applied in the present invention and are covered by the scope of the present invention.

Figure 11A:
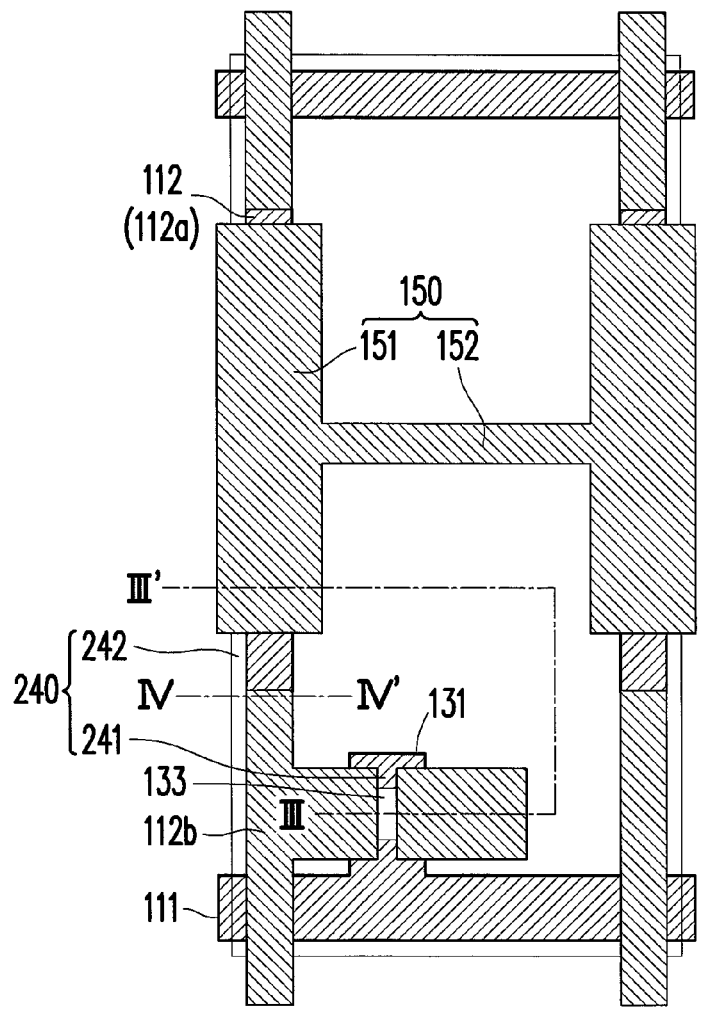
FIG. 11A is a schematic top view of a pixel structure of a second embodiment of the present invention.
Figure 11B:
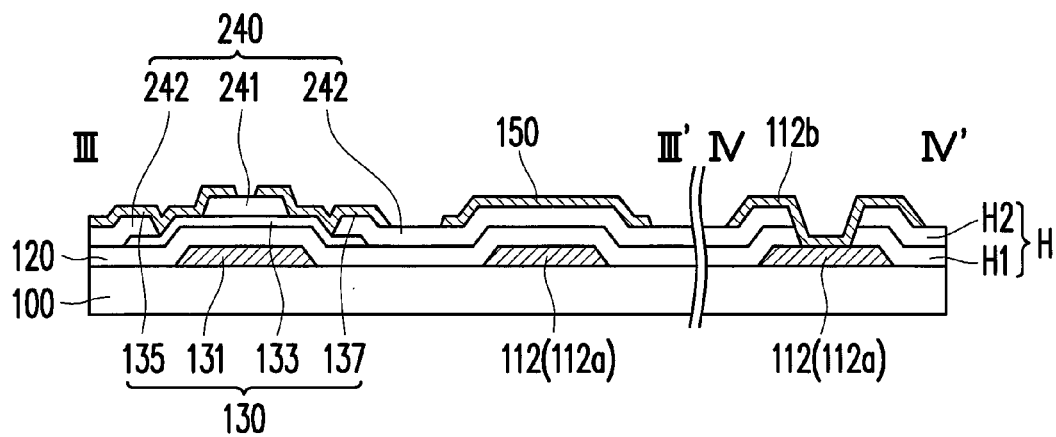
FIG. 11B is a cross-sectional view of the pixel structure in FIG. 11A along section lines III-III' and IV-IV'.

Next, as shown in FIG. 11A and FIG. 11B, the patterned second conductive layer is manufactured on the second insulating layer 240 to form the source electrode 135, the drain electrode 137, the cross-line transmitting part 112b and the common electrode 150. In this case, the source electrode 135 and the drain electrode 137 are connected to the oxide channel 133 via the opening H3 and the opening H4 of the second insulating layer 240, while the cross-line transmitting part 112b is connected to the linear transmitting part 112a via the contact opening H formed of the first opening H1 of the first insulating layer and the second opening H2 of the second insulating layer 240.

Figure 12A:
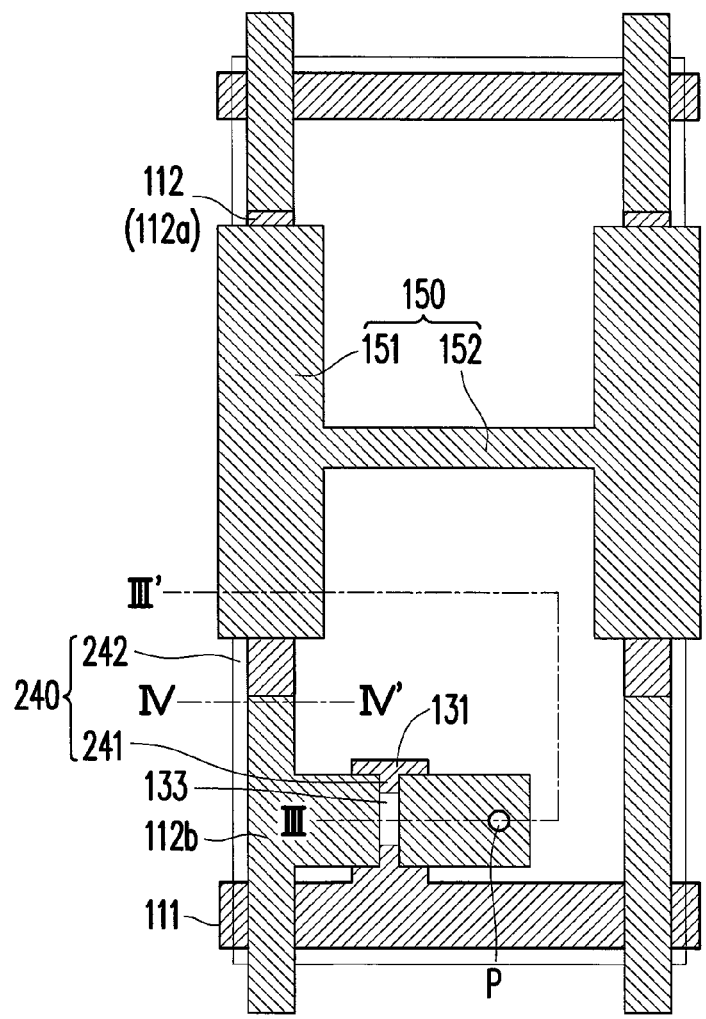
FIG. 12A is a schematic top view of a pixel structure of a second embodiment of the present invention.
Figure 12B:
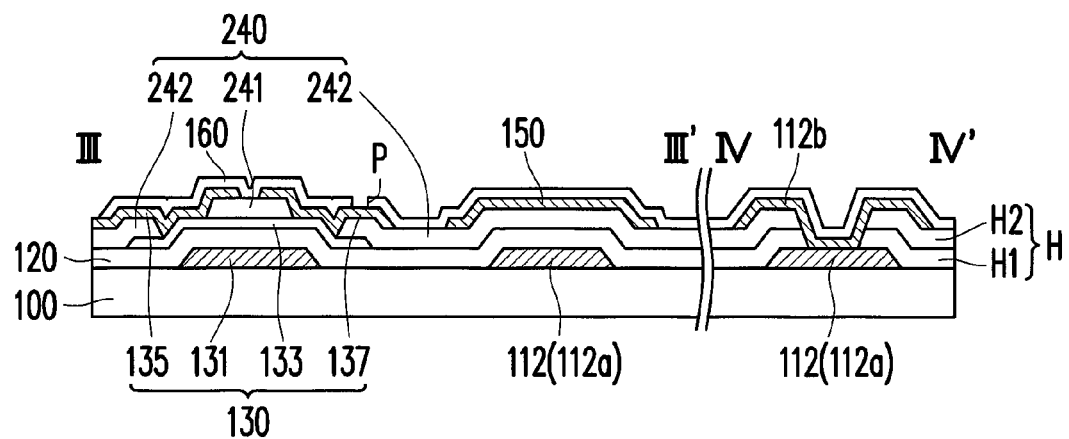
FIG. 12B is a cross-sectional view of the pixel structure in FIG. 12A along section lines III-III' and IV-IV'.

In the subsequent steps, the third insulating layer 160 may be formed with reference to the manufacturing methods in the previous embodiments, which covers the active device 130 and the common electrode 150, and the third opening p is formed therein, as shown in FIG. 12A and FIG. 12B. Then, the first pixel electrode 170 is formed on the substrate 100, i.e., the first pixel electrode 170 is formed on the third insulating layer 160, so that the first pixel electrode 170 is connected to the drain electrode 137 via the third opening p, as shown in FIG. 9A and FIG. 9B. In this embodiment, the openings H1, H2, H3, and H4 may be formed on the first insulating layer 120 and the second insulating layer 140 by the same photo-lithography process by using the half-tone mask, so as to reduce the number of the photo masks to reduce the manufacturing cost and simplify the manufacturing process steps.

Third Embodiment

Figure 13A:
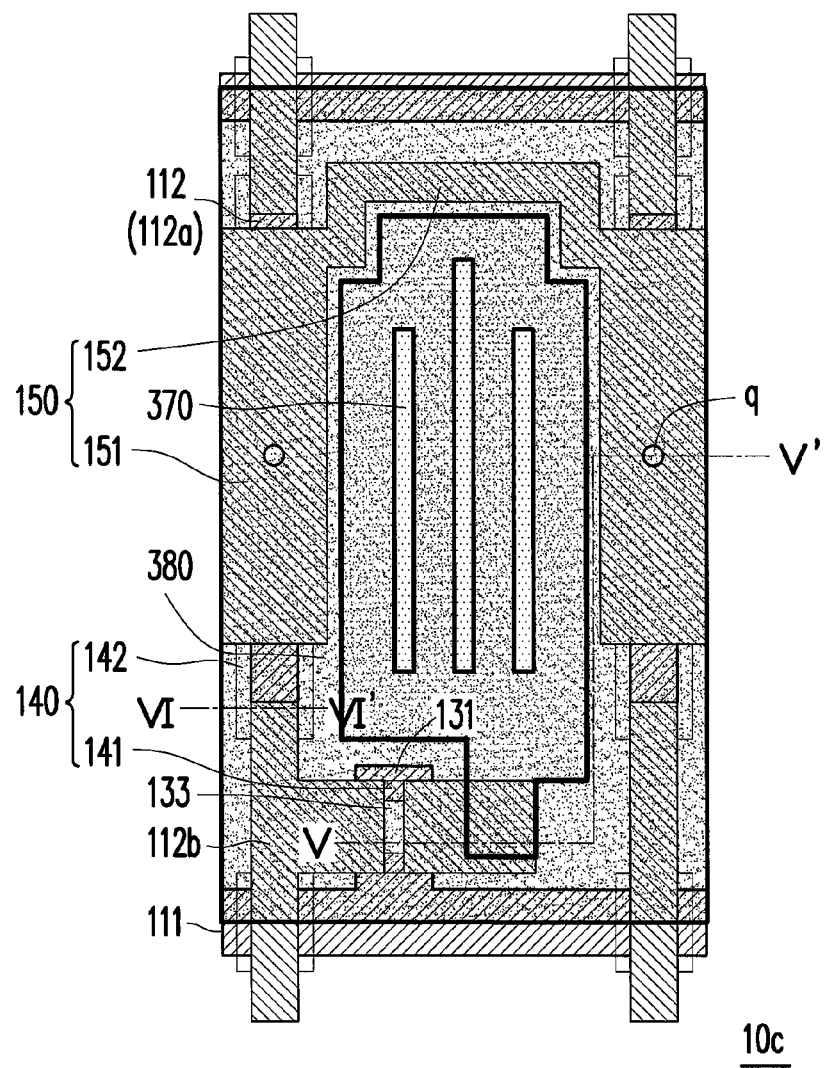
FIG. 13A is a schematic top view of a pixel structure of a third embodiment of the present invention.
Figure 13B:
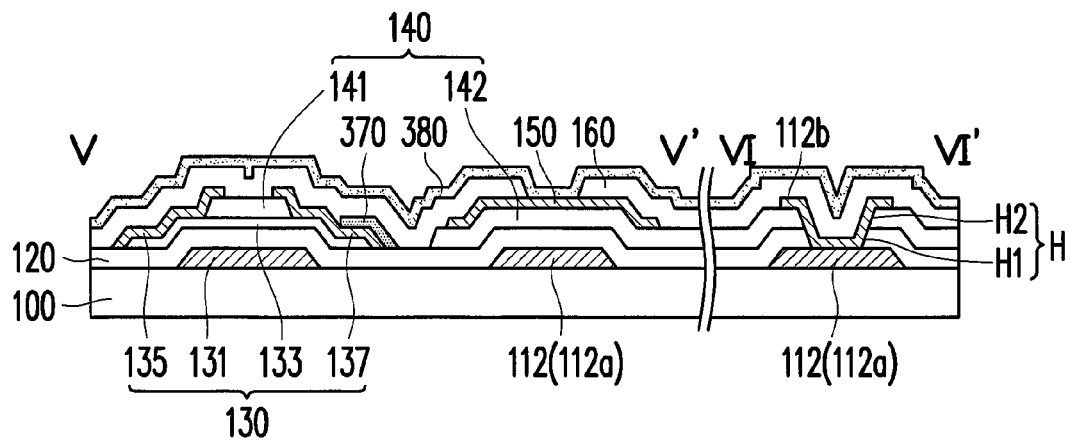
FIG. 13B is a cross-sectional view of the pixel structure in FIG. 13A along section lines V-V' and VI-VI'.
Figure 14A:
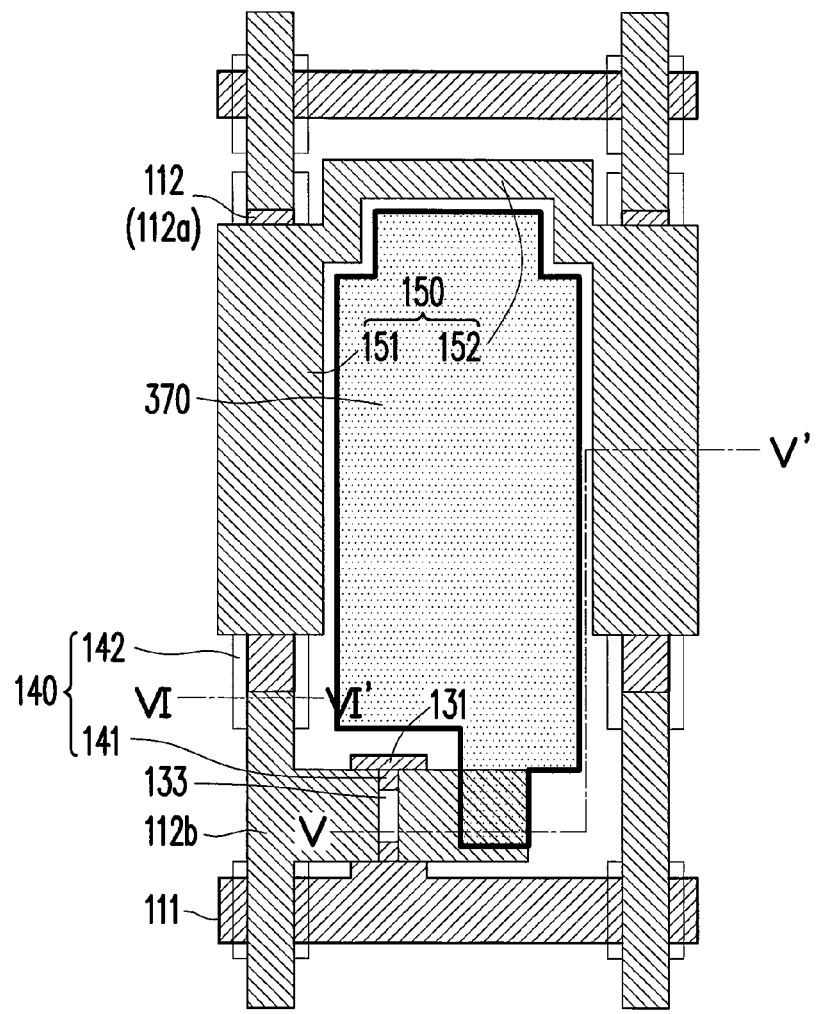
FIG. 14A is a schematic top view of a pixel structure of a third embodiment of the present invention.
Figure 14B:
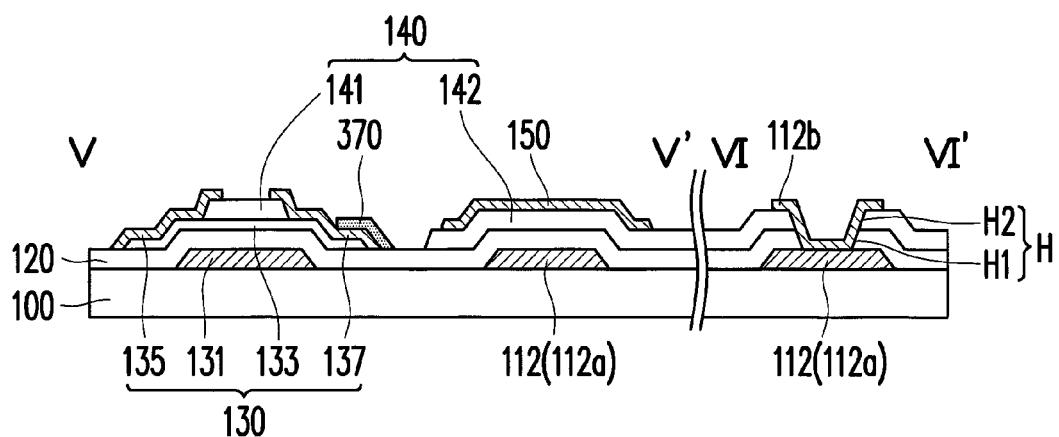
FIG. 14B is a cross-sectional view of the pixel structure in FIG. 14A along section lines V-V' and VI-VI'.

FIG. 13A is a schematic top view of a pixel structure of the third embodiment of the present invention, while FIG. 13B is a cross-sectional view of the pixel structure in FIG. 13A along section lines V-V' and VI-VI'. Referring to FIG. 13A and FIG. 13B, the pixel structure 10c of this embodiment is similar to the pixel structure 10a of the first embodiment, and the manufacturing method thereof may refer to the explanations in FIGS. 1A-7A and FIGS. 1B-7B. However, the difference between the pixel structure 10c of this embodiment and the pixel structure 10a lies in: after the patterned second conductive layer is formed on the second insulating layer 140 to define the source electrode 135, the drain electrode 137, the cross-line transmitting part 112b and the common electrode 150, referring to FIG. 14A and FIG. 14B, the first pixel electrode 370 is manufactured on the substrate 100, and the first pixel electrode 370 is connected to the drain electrode 137. Herein, the first part 151 and the second part 152 of the common electrode 150 together surround the edges of the first pixel electrode 370.

Figure 15A:
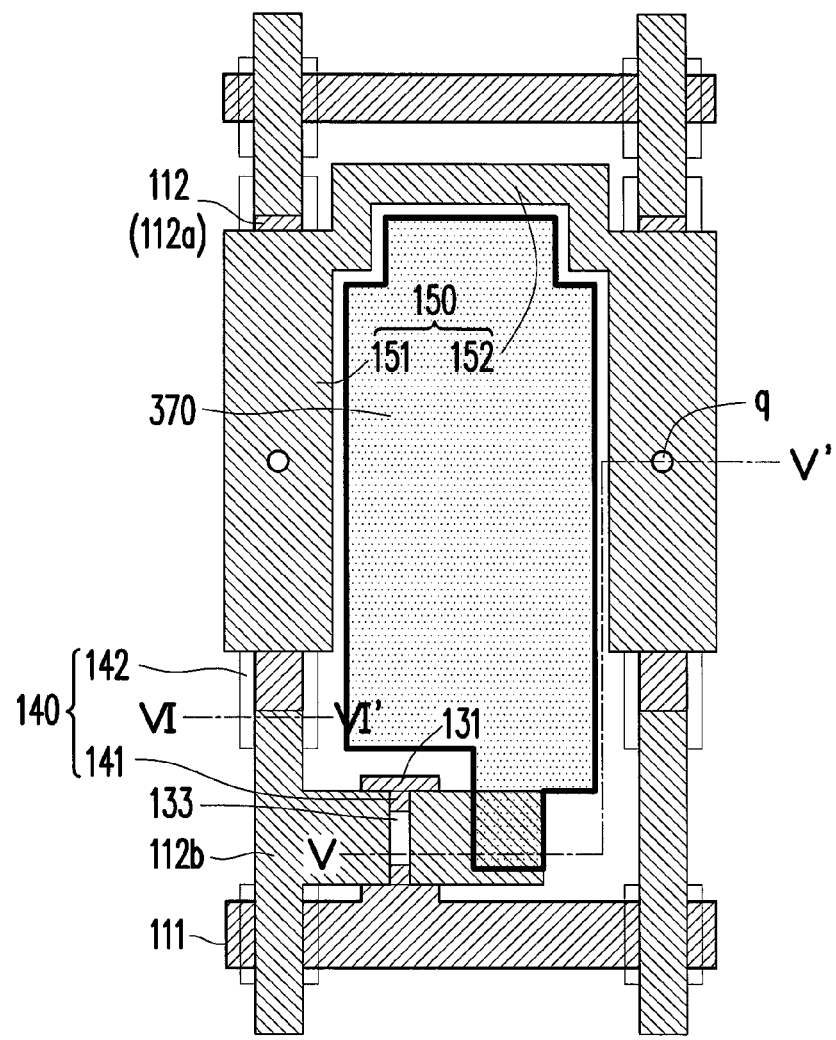
FIG. 15A is a schematic top view of a pixel structure of a third embodiment of the present invention.
Figure 15B:
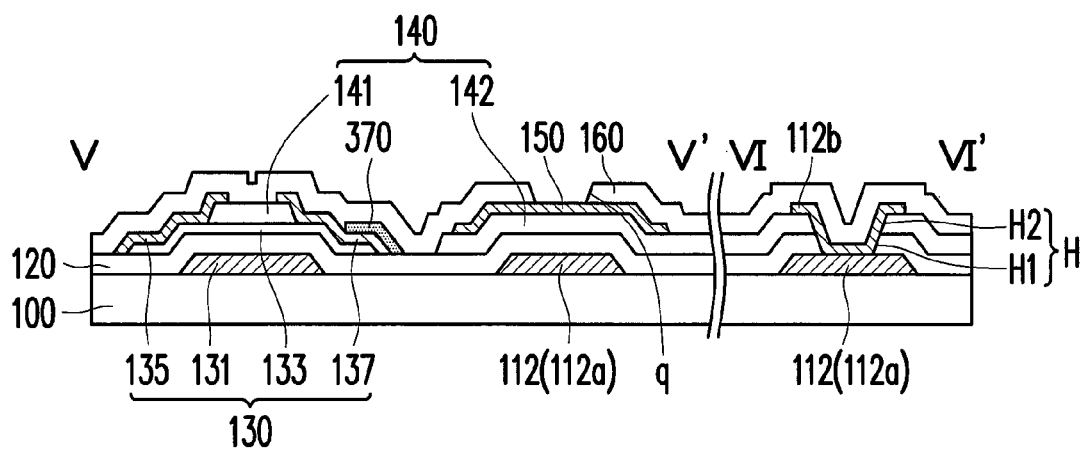
FIG. 15B is a cross-sectional view of the pixel structure in FIG. 15A along section lines V-V' and VI-VI'.

Next, as shown in FIG. 15A and FIG. 15B, the third insulating layer 160 covers the substrate 100, i.e., the third insulating layer 160 covers the active device 130, the common electrode 150, the cross-line transmitting part 112b and the first pixel electrode 370, and the third opening q is formed on the third insulating layer 160, the common electrode 150 is partly exposed by the third opening q, and preferably, the part of the common electrode 150 located on the linear transmitting part 112a of the data line 112 is exposed by the third opening q.

Finally, as shown in FIG. 13A and FIG. 13B, the second pixel electrode 380 is formed on the third insulating layer 160, in other words, the first pixel electrode 370 and the second pixel electrode 380 are located on two opposite sides of the third insulating layer 160 respectively. The second pixel electrode 380 may cover the common electrode 150 and be electrically connected to the common electrode 150 via the third opening q within the third insulating layer 160.

In addition, the first pixel electrode 370 and the second pixel electrode 380, for example, are patterned, so that the first pixel electrode 370 substantially has a finger-shaped pattern (not shown) while the second pixel electrode 380, for example, has multiple openings or slits located above the first pixel electrode 370. Namely, the third insulating layer 160 is located between the first pixel electrode 370 and the second pixel electrode 380, and the second pixel electrode 380 has a plurality of slits located above the first pixel electrode 370. In this case, the area of the first pixel electrode 370 on the substrate 100 is partly exposed by the area of the second pixel electrode 380 on the substrate 100 to provide the fringe field effect. Therefore, the pixel structure 10c of this embodiment may be applied in, for example, a pixel design of fringe field switching mode (FFS). However, the pattern design and the shapes of the first pixel electrode 370 and the second pixel electrode 380 are not particularly limited in the present invention, and the aforementioned finger-shaped pattern and shape are only used for exemplary explanation, not for limitation of the scope of the present invention.

Fourth Embodiment

Figure 16A:
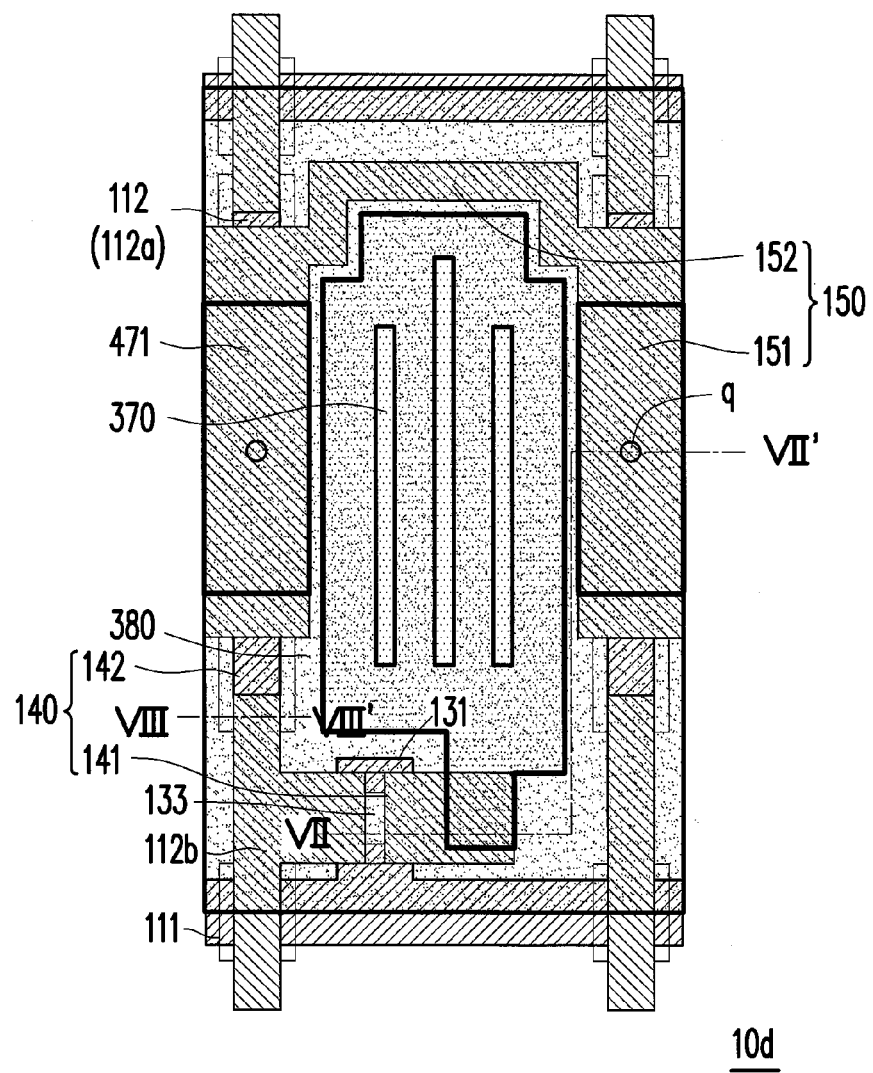
FIG. 16A is a schematic top view of a pixel structure of a fourth embodiment of the present invention.
Figure 16B:
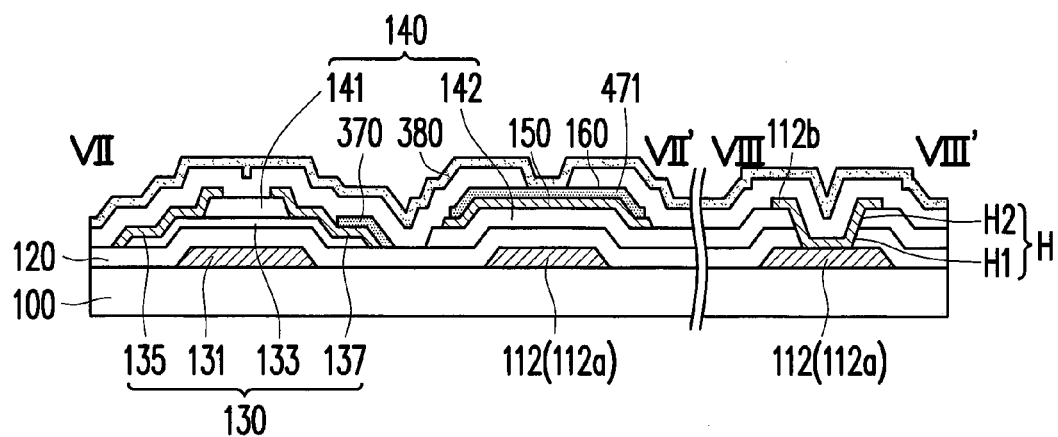
FIG. 16B is a cross-sectional view of the pixel structure in FIG. 16A along section lines VII-VII' and VIII-VIII'.

FIG. 16A is a schematic top view of a pixel structure of the fourth embodiment of the present invention, while FIG. 16B is a cross-sectional view of the pixel structure in FIG. 16A along section lines VII-VII' and VIII-VIII'. Referring to FIG. 16A and FIG. 16B, the pixel structure 10d of this embodiment is similar to the pixel structure 10c of the third embodiment, and the manufacturing method thereof may refer to FIGS. 1A-7A to FIGS. 1B-7B and FIGS. 14A-15A to FIGS. 14B-15B. However, the difference between the pixel structure 10d of this embodiment and the pixel structure 10c lies in: after the patterned second conductive layer is formed on the second insulating layer 140 to define the source electrode 135, the drain electrode 137, the cross-line transmitting part 112b and the common electrode 150, referring to FIG. 16A and FIG. 16B, the first pixel electrode 370 and the auxiliary electrode 471 are formed on the substrate 100 simultaneously so that the auxiliary electrode 470 is disposed between the third insulating layer 160 and the common electrode 150, where the auxiliary electrode 471 and the first pixel electrode 370 are separated from each other. That is to say, the auxiliary electrode 471 and the first pixel electrode 370 are formed by the same film layer, but not connected to each other. Specifically speaking, the first pixel electrode 370 is connected to the drain electrode 137, while the auxiliary electrode 471 covers and contacts the common electrode 150 so as to be electrically connected to the common electrode 150. The designed pattern of the auxiliary electrode 471 is not limited in the present invention. The manufacturing method of the third insulating layer 160 and the second pixel electrode 380 and the explanation of the fringe electric field provided by the first pixel electrode 370 and the second pixel electrode 380 may refer to the third embodiment, which is not repeated herein.

Based on the above, in the pixel structure and the manufacturing method thereof according to the present invention, the linear transmitting part of the data line, the scan line and the gate electrode are formed by the same layer through patterning the first conductive layer, and the cross-line transmitting part of the data line crosses over the scan line to be electrically connected to the linear transmitting part of the data line. The first insulating layer is formed on the linear transmitting part of the data line, the scan line and the gate electrode, and the second insulating layer is disposed to form the etching blocking pattern and the isolation pattern respectively on the oxide channel and the linear transmitting part. In addition, the common electrode is disposed on the second insulating layer, and the pixel electrode covers the common electrode. Hence, in the pixel structure and the manufacturing method thereof according to the present invention, the linear transmitting part of the data line and the common electrode may be spaced by multiple layers of insulating layers (which include the first insulating layer and the second insulating layer). In this way, not only may the etching blocking pattern be manufactured to protect the oxide channel, but also the parasitic capacitance between the data line and the common electrode may be reduced, so as to reduce the consumed power of the pixel structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
    a substrate,
    a scan line, disposed on the substrate;
    a data line, disposed on the substrate, the scan line crossed to the data line, and the data line comprising a linear transmitting part and a cross-line transmitting part connected to each other, wherein the cross-line transmitting part crosses over the scan line;
    a first insulating layer, covering the scan line and the linear transmitting part and located between the scan line and the cross-line transmitting part;
    an active device, connected to the scan line and the data line, wherein the active device comprises:
        a gate electrode, connected to the scan line;
        an oxide channel, located above the gate electrode, and the first insulating layer located between the gate electrode and the oxide channel;
        a source electrode, connected to the cross-line transmitting part of the data line; and
        a drain electrode, the source electrode and the drain electrode located at two sides of the oxide channel;
    a second insulating layer, comprising an etching blocking pattern located on the oxide channel and the gate electrode, and an isolation pattern located on the linear transmitting part, wherein the etching blocking pattern is located within a boundary of the gate electrode and not in direct contact with the first insulating layer, the isolation pattern is contacting the first insulating layer, and the etching blocking pattern and the isolation pattern of the second insulating layer are not continuous and do not directly contact each other;
    a common electrode, disposed on the isolation pattern and located on the linear transmitting part, wherein the first insulating layer and the second insulating layer are disposed between the common electrode and the linear transmitting part, and the common electrode is electrically isolated from the data line; and
    a first pixel electrode, connected to the drain electrode.

2. The pixel structure according to claim 1, wherein the cross-line transmitting part is connected to the linear transmitting part via a contact opening within the first insulating layer and the second insulating layer.

3. The pixel structure according to claim 1, wherein the common electrode comprises a first part and at least one second part connected to each other, the first part at least partly overlaps the linear transmitting part, while an extending direction of the second part is not parallel to an extending direction of the first part.

4. The pixel structure according to claim 3, wherein the first part and the second part surround edges of the first pixel electrode.

5. The pixel structure according to claim 3, wherein the second part overlaps the first pixel electrode and the first part is located at an edge of the first pixel electrode.

6. The pixel structure according to claim 3, wherein a width of the first part is larger than a line width of the linear transmitting part.

7. The pixel structure according to claim 3, wherein the first part contacts the isolation pattern of the second insulating layer.

8. The pixel structure according to claim 1, further comprising a third insulating layer, covering the active device and the common electrode.

9. The pixel structure according to claim 8, wherein the first pixel electrode is substantially located on the third insulating layer and the first pixel electrode is electrically connected to the drain electrode via a third opening within the third insulating layer.

10. The pixel structure according to claim 8, further comprising a second pixel electrode disposed on the third insulating layer and covering the common electrode, wherein the second pixel electrode is electrically connected to the common electrode via a third opening within the third insulating layer.

11. The pixel structure according to claim 10, wherein the third insulating layer is located between the first pixel electrode and the second pixel electrode, and the second pixel electrode has a plurality of slits located above the first pixel electrode.

12. The pixel structure according to claim 10, further comprising an auxiliary electrode covering the common electrode, and the auxiliary electrode and the first pixel electrode formed by a same film layer.

13. The pixel structure according to claim 1, wherein the isolation pattern is further located between the first pixel electrode and the first insulating layer.

* * * * *